United States Patent [19]

Warner

[11] Patent Number: 4,839,909
[45] Date of Patent: Jun. 13, 1989

[54] REGISTER ACCESS DECADE COUNTING TECHNIQUE

[75] Inventor: David J. Warner, Weybridge, Great Britain

[73] Assignee: Hughes Microelectronics Limited, Glenrothes, Scotland

[21] Appl. No.: 119,922

[22] Filed: Nov. 13, 1987

[51] Int. Cl.[4] .................. H03K 21/16; H03K 21/12; G11C 7/00; G11C 21/00

[52] U.S. Cl. ......................... 377/24.1; 377/34; 377/54; 377/67; 377/114; 365/236; 365/240

[58] Field of Search ............... 377/24.1, 33, 34, 54, 377/67, 114, 124; 365/220, 221, 236, 339, 240

[56] References Cited

U.S. PATENT DOCUMENTS

| | | | |
|---|---|---|---|
| 3,316,540 | 4/1967 | Nissim | 365/239 |
| 3,764,782 | 10/1973 | Spauszug et al. | 377/54 |
| 3,851,313 | 11/1974 | Chang | 365/240 |
| 3,984,815 | 10/1976 | Drexler et al. | 377/34 |
| 4,663,770 | 5/1987 | Murray et al. | 377/24.1 |
| 4,757,522 | 7/1988 | Kieselstein | 377/33 |

Primary Examiner—John S. Heyman
Attorney, Agent, or Firm—Terje Gudmestad; Kenneth W. Float; A. W. Karambelas

[57] ABSTRACT

An electronic counter such as for use in the odometer of a motor vehicle is provided comprising an array (10) of m rows and n columns of single flip-flop data latches and a central shifting unit (14). The central shifting unit (14) comprises a row of n data latches arranged to read data from and write data to each of the m rows of data latches of the array (10). In operation, the central shifting unit (14) reads data from a row of data latches of the array, performs a shift operation on the data and an invert operation on one of n data latches of the central shifting unit (14) and returns the data so operated on to the row of data latches in the array (10). By these steps, a counting operation in Johnson code is performed on the data. This invention uses less chip area than known counters.

8 Claims, 3 Drawing Sheets

REGISTER ACCESS DECADE COUNTING TECHNIQUE

This invention relates to an electronic counter such as for use in the odometer of a motor vehicle.

BACKGROUND OF THE INVENTION

A common form of electronic counter is a digital incremental divide-by-10 (decade) circuit commonly comprising a set of four or five D-type filp-flops which increment with the application of input pulses, such as at 100 meter intervals of travel of a motor vehicle, together with a logical function to detect the presence of the "nine" state which acts to clear the decade to zero on receipt of the next input pulse, and sends a "carry" pulse to the subsequent decade or decades.

One such counting circuit is described in U.S. Pat. No. 4,663,770. The counter described in the specification of that patent application incorporates an array of D-type flip-flops forming a plurality of decade counters. Each flip-flop incorporates a master flip-flop and a slave flip-flop in order to avoid problems associated with the synchronization of the clock signal with a rapidly changing data input signal.

Counters of this type are generally manufactured as custom made integrated circuits and it would be desirable to reduce the area occupied by a single counter integrated circuit so that more such circuits can be fitted onto a single silicon wafer and their unit cost can be reduced. It would also be advantageous to simplify the testing of a single circuit, again reducing the unit cost of manufacture.

SUMMARY OF THE INVENTION

According to the present invention there is provided an electronic counter comprising an array of m rows and n columns of single flip-flop data latches and a central shifting register or unit comprising a row of n data latches arranged to read data from, and write data to, each of the m rows of data latches of the array. The central shifting register is arranged to read data from a row of data latches of the array, perform a shift operation on the data and an invert operation on the data in one of the n data latches of the register, and return the data so operated on the row of data latches in the array. The data is thus returned to the array with a counting operation having been performed on it.

Preferably, carry detection and generation means are provided for detecting when a counting operation results in the data in a row incrementing from its highest state to zero and generating a carry signal to initiate a counting operation in a higher order row. Addressing means may be provided for addressing and enabling a selected row of data latches in the array, whereby, on generation of a carry signal during a counting operation in any given row, the addressing means addresses a high order row to allow the counting operation in that higher row to be carried out.

Preferably the carry detection means comprise means for detecting a change of one of the data latches in the array from a first state to a second state.

Carry control means may be provided for causing the carry generator to generate a carry signal regardless of the contents of the central shifting unit. Serial data input means may be provided for entering serial data onto the central shifting unit.

In effect, the invention dispenses with the need for a master flip-flop in each data latch of the array, thus reducing the area occupied by the array. Instead of having a master in each data latch, the central shifting unit services as the master for the whole array. Thus the timing of the data and clock signals does not require extra consideration, as would be the case if no master flip-flops whatsoever were used.

BRIEF DESCRIPTION OF THE DRAWING

A preferred embodiment of the invention will now be described with reference to the accompanying drawing figures, in which:

FIG. 5 shows what circuit diagram for a single data latch of the central shifting unit of FIG. 3.

DETAILED DESCRIPTION

Figure 1:
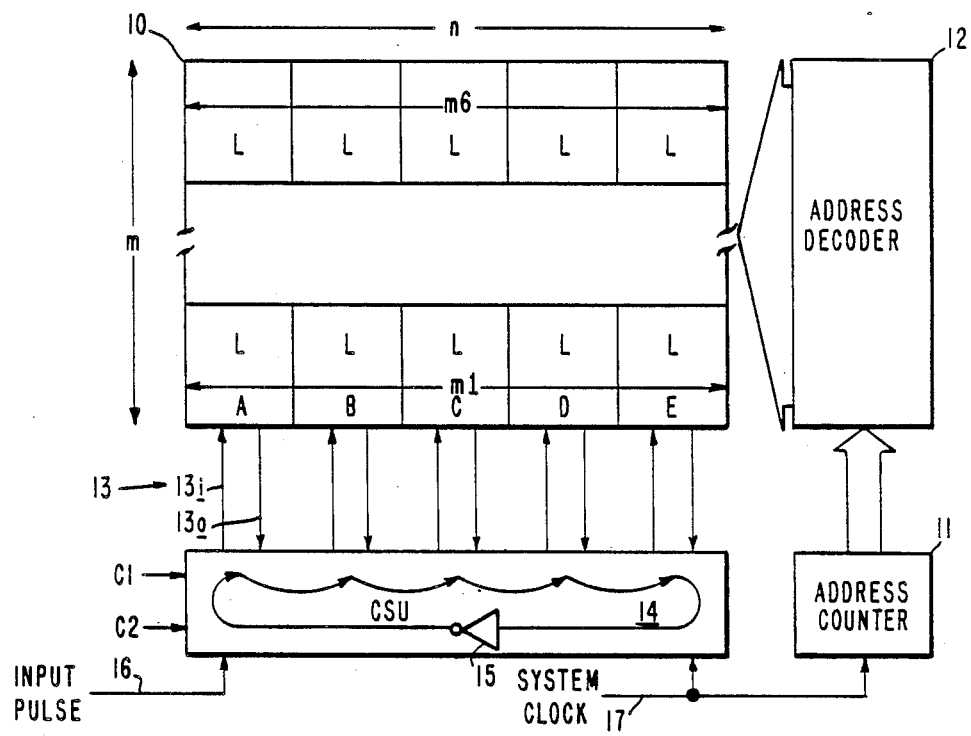
FIG. 1 shows the overall layout of a counter for the odometer of a motor vehicle.

Referring to FIG. 1, the counter is shown to comprise an array 10 of data latches, L, arranged as six rows or decades, of five bits each (m=6, n=5). The first (m1) and sixth (m6) decades are shown in the FIGURE. The decades are addressed by an address counter 11 via an address decoder 12. Data enters and leaves the array 10 by means of a data bus 13, through input lines 13$i$ and output lines 13$o$. Communicating with the data bus 13 is a central shifting unit (CSU) 14. The lines of the data 13 bus are labelled A, B, C, D and E, each line communicating with one of the five latches of each decade. The counter is provided with an "event" input line 16 from a prescaler (not shown) which gives a pulse every 100 meters of travel of a vehicle to which it is connected. The operation of the counter is governed by a three phase system clock 17, providing "peek", "poke", and "increment" clock pulses. Inputs C1 and C2 are described in detail below with reference to FIG. 3.

Figure 2:
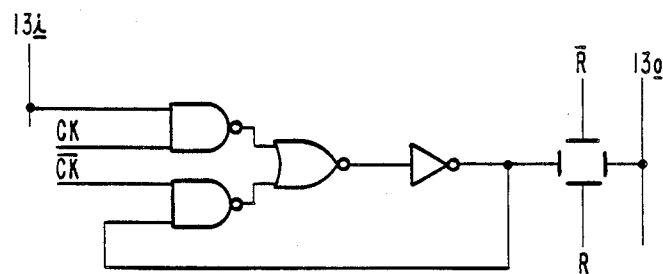
FIG. 2 shows a single data latch which is the basic storage unit for each of the decade counters employed in the FIG. 1 counter.

FIG. 2 shows a data latch L forming one element of the array 10. The data latch is connected to the data bus lines 13$i$ and 13$o$ and has clock input (poke) lines CK and $\overline{CK}$ and read command (peek lines R and $\overline{R}$. During operation, data is presented on the input bus line 13$i$, is clocked into the latch on the occurrence of a poke clock signal and stored when the clock signal is removed. The content of the latch is read out onto the output bus line 13$o$ when the latch is addressed and a peek clock signal provided. When not addressed, the output is at high impedance, permitting another addressed latch to enforce the bus 13$o$. A set of five latches L with common clock and address lines comprise one decade of the counter array 10.

Figure 3:
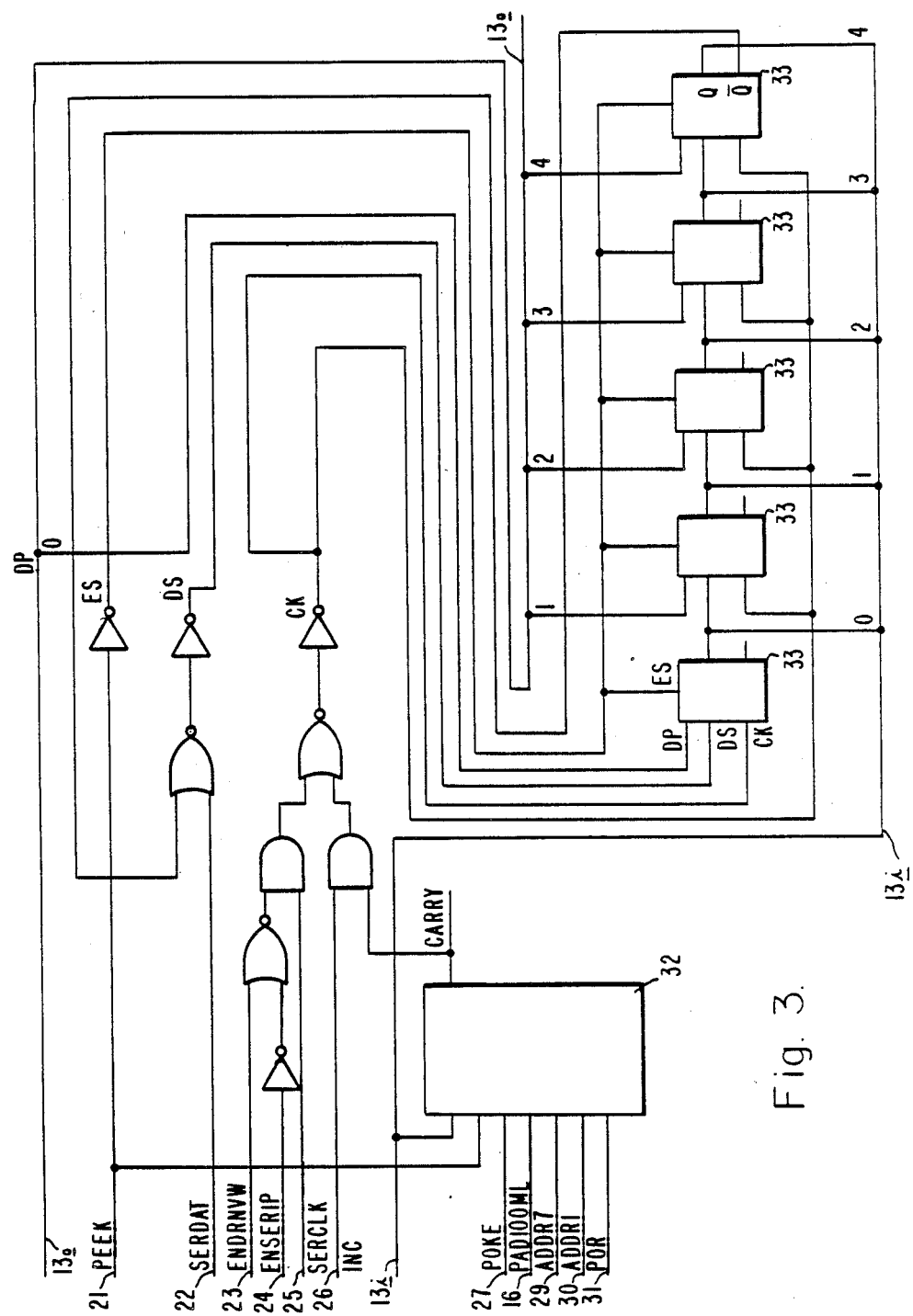
FIG. 3 shows the circuit diagram of the central shifting unit employed in the FIG. 1 counter.

Referring to FIG. 3, the more detailed circuit diagram of the CSU 14 is shown. At the top of the Figure is the output data bus 13$o$ (actually bus lines 13$o$ A to E), which provides the inputs for CSU 14. At the bottom of the FIGURE is the input data bus 13$i$ (actually bus lines 13$i$ A to E) which draws the output data from the CSU 14 for the latches L. The lines on the left hand-side are designated as follows:

21 (PEEK) receives the peek signal from the system clock 17;

22 (SERDAT) is a serial data input line for receiving serial data to set the counter to any desired state;

23 (ENDRNVW) is an enable division ratio non-volatile write input used to allow the user to access portions of memory to allocate division ratios;

24 (ENSERIP) is an enable serial input to allow the input of serial data;

25 (SERCLK) is a serial clock for clocking in serial data;

26 (INC) receives the increment signal from the system clock 17;

16 IPAD100ML) receives the 100 meter pulse input from the prescaler (the "event" input);

29 (ADDR7) receives an address input from decade 7 of the address decoder —decades 7 and above are the locations of the "total" odometer on the dashboard of the vehicle;

20 (ADDR1) an address input from decade 1 of the address decoder —decades 1 to 4 are the locations of the "trip" or resettable odometer on the dashboard of the vehicle;

31 (POR) receives a parallel reset input to reset the carry generator when the battery of the vehicle is reconnected.

Figure 4:
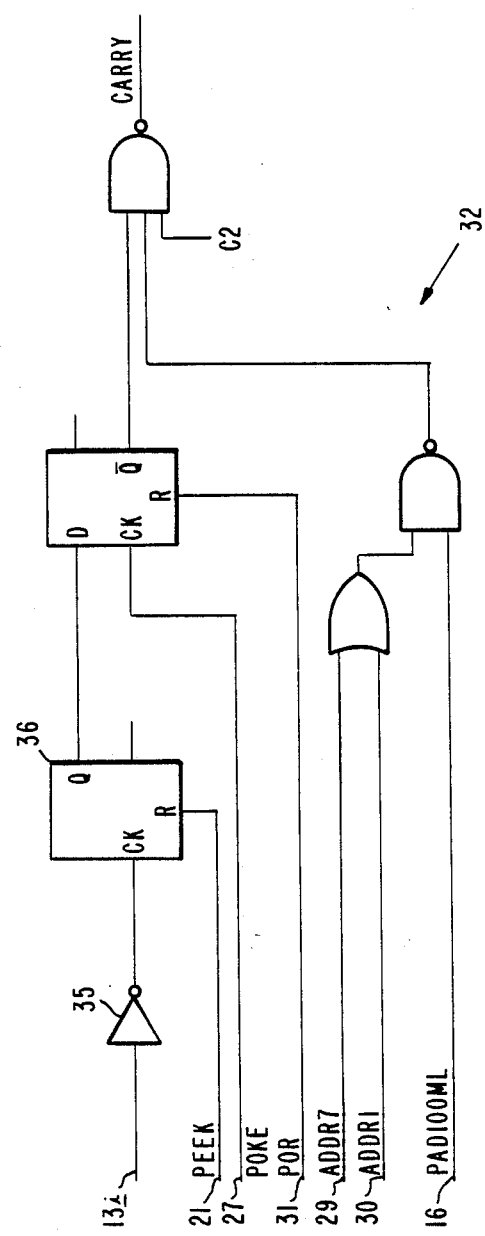
FIG. 4 shows the circuit diagram for the carry generator shown in FIG. 3.

A carry generator 32 is shown in FIG. 3 and this is illustrated in greater detail on FIG. 4. A plurality of latch elements 33 are connected between data buses 13o and 13i and one of these is illustrated in greater detail in FIG. 5.

Referring again to FIG. 1, the CSU 14 is arranged to perform a shift operation, shifting the data in each latch to the right as shown. The data in the right hand latch is inverted in an inverter 15 and shifted around the left-most latch.

By this arrangement, the CSU 14 is arranged, together with any one of the six decades, to count from 0 to 9 using Johnson code as shown by Sequence A of the following table.

| SEQUENCE A | SEQUENCE B | SEQUENCE C | SEQUENCE D |
|---|---|---|---|
| 00000 (*) | 00010 (*) | 00100 (*) | 01010 (*) |
| 00001 | 00101 | 01001 | 10101 |
| 00011 | 01011 | 10011 | |
| 00111 | 10111 | 00110 (*) | |
| 01111 | 01110 (*) | 01101 | |
| 11111 | 11101 | 11011 | |
| 11110 | 11010 | 10110 | |
| 11100 | 10100 | 01100 (*) | |
| 11000 | 01000 (*) | 11001 | |
| 10000 | 10001 | 10010 | |

In a five-bit twisted ring counting system, 32 (=2 raised to the power of 5) possible state combinations can arise due to random electrical influences. Ten of these combinations are part of the desired counting sequence, (Sequence A above) and the remaining 22 can lead to one of three redundant sequences (Sequence B, C, D). Once one of these sequences has been entered it can not be left.

The data stored in the decades will be one of the ten codes of Sequence A. A decoder (not shown) is used to decode this into Binary Coded Decimal. The decoder data can be displayed on the odometer of the vehicle.

The operation of the counter is as follows. When an event occurs, e.g. the prescaler registers 100 m of travel, a pulse is input to the CSU 14 on the input line 16. At this point, three basic operations occur, all controlled by the system clock 17. With the address counter 11 set at 1, the address decoder 12 addresses the first decade. First, a peek pulse from system clock 17 causes the data stored in the first decade to be output to the CSU 14. Second, an increment pulse from system clock 17 causes the CSU to shift the data to the right, and third the shifted data in the CSU 14 is output back to the first decade where it is stored. This third operation is controlled by a poke signal from the clock. Should the code change from 9 to 0, then a carry is detected, as will be described below, and stored in the carry generator 32 shown in FIG. 3. When this happens, the address counter 11 increments and the three operations are repeated for the next decade. This continues through the decades for as long as carry signals are generated in any decade. When there are no further carry signals, the counting operation has been completed and the clock waits for the next event, e.g. the next kilometer.

A carry signal is detected and generated as follows. Referring to Table 1, it can be seen that when Sequence A changes from 9 to 0, the most significant bit changes from 1 to 0. In Sequence A, this happens only once throughout the sequence. An inverter gate 35, shown in FIG. 4 is connected to CSU input data bus 13i (see FIG. 3), i.e. the most significant bit. When that bit changes from 1 to 0, the inverter 35 provides a signal rising from 0 to 1 and this signal activates a latch 36 to provide a carry signal. An alternative method of detecting a carry would be to detect when the first and last bits are zero.

Facilities for testing the counter are provided by means of various control signals. For example, inputs 22, 24 and 25 of FIG. 3 can be used to input serial data to arrive at any required counting state. These may collectively be referred to as C1 as shown in FIG. 1. A carry control input C2 can be provided (FIG. 4) to cause a carry to be simulated which enables registers to be sequentially incremented. An example of a test routine is as follows. C1 is activated to clear the CSU 14 and hold it at 00000 and this is entered into the six decades by allowing the address counter to count through the six addresses, while at each address the clock generates a poke signal to store the 00000 data into each decade. The array 10 is now set at 00000 throughout the decades. C2 is now activated and the counting sequence started. Because a carry signal is constantly being generated, one complete cycle of the address counter 11 causes each of the six decades to store the code representing 1. The counting sequence is repeated by providing a second input pulse on line 16 and this causes each of the six decades to store the code representing 2. This repeated until each decade stores the code equivalent to 9. Control signal C2 is now removed and the counter can run in its normal mode, with all the decades set a 9. This state can be observed and check merely by monitoring the CSU 14 for each decade. At this point, the generation of one more input pulse will roll all the decades over to the 00000 state once more. This is done and again the CSU 14 is observed to ensure that all six decades are now in the zero state.

This testing routine does not require a reset line for each individual data latch of the 5×6 array and therefore a saving in chip area has been made, both in terms of metal connections and buffer gates for each of the data latches. The arrangement avoids the need to count through each of the one million counting states and therefore the speed and ease of the test routine is greatly increased. The C1 and C2 signals allow any counting state to be reached easily, e.g. for testing. The use of a single CSU 14 gives good observantly.

The Johnson code counting operation can be implemented in other ways, e.g. by having each output from the data bus connected to the adjacent input of the CSU, i.e. bus A connected to CSU input B etc., with bus E output inverted and connected back to CSU input A.

If desired, a method of error correction can readily be provided because the counter already has a built in method of leaving one of the possible redundant sequences B, C and D of Table 1 and returning to sequence A. This is achieved by entering 00000 into decade at the same time as detecting a carry. This will be explained with reference to the states shown in Table 1 which are marked with an asterisk (*). Each of these states is arrived at by the change of the Most Significant Bit from 1 to 0. Should one of the redundant sequences B, C or D inadvertently be entered, then when one of the states marked is reached, the carry generator 32 detects the change from 1 to 0 and simultaneously enters 0 into each bit of the CSU 14. By doing this, the code has returned to Sequence A. The false code situation has been recovered but not in the sense of a restoration of the required count state, as this is indeterminable, rather the code has been returned to the start of Sequence A, from which it can begin to count normally in decades. This contrasts with other implementations of false code detection, where the false code has to be artificially introduced into the system during testing in order to prove that it will operate correctly.

The technique of Indexed Addressing such as is described in U.S. Pat. No. 4,663,770 is readily adaptable to the counter of the present invention. When the highest order decade is incremented, all the other decades are at zero. A detector is provided to detect this event, whereupon the address decoder 12 is reconfigured to change the allocation of addresses selected by the address counter 11. This means that a different row of latches is allocated to the lowest order decade so as to distribute the wear on the latches.

I claim:

1. An electronic counter comprising an array (10) of m rows and n columns of single flip-flop data latches and central shifting means (14) comprising a row of n data latches (33) for reading data from and writing data to each of the m rows of data latches of the array (10), such that the central shifting means (14) reads data from a row of data latches of the array (10), performs a shift operation on the data and an invert operation on the data in one of the n data latches and returns the data so operated on to the row of data latches in the array (10), whereby the data is returned to the array with a counting operation having been performed on it.

2. A counter according to claim 1 wherein carry detection and generation means (32) are provided for detecting when a counting operation results in the data in a row incrementing from its highest state to zero and generating a carry signal to initiate a counting operation in a higher order row.

3. A counter according to claim 2 further comprising addressing means (11, 12) for addressing and enabling a selected row of data latches in the array (10) whereby, on generation of a carry signal during a counting operation in any given row, the addressing means (11, 12) addresses a higher order row to allow the counting operation in that higher order row to be carried out.

4. A counter according to claim 2 wherein the carry detection means comprise means (35) for detecting a change of one of the data latches in the array from a first state to a second state.

5. A counter according to claim 2 wherein carry control means (C2) are provided for causing the carry generator to generate a carry signal, regardless of the contents of the central shifting means.

6. A counter according to claim 1 wherein serial data input means (22, 24, 25) are provided for entering selected data into the central shifting means (14).

7. The counter according to claim 1 wherein the central shifting means comprises shifting means for shifting data by one column in the row of data latches.

8. The counter according to claim 1 wherein the central shifting means comprises shifting means for shifting data by one column from left to right in the row of data latches and inverting the data in the right most latch before returning it to the left most latch in the row.

* * * * *